(12) United States Patent
Kim et al.

(10) Patent No.: US 7,504,871 B2
(45) Date of Patent: Mar. 17, 2009

(54) FLIP-FLOPS AND ELECTRONIC DIGITAL CIRCUITS INCLUDING THE SAME

(75) Inventors: Min-Su Kim, Hwaseong-si (KR); Bai-Sun Kong, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 70 days.

(21) Appl. No.: 11/819,388

(22) Filed: Jun. 27, 2007

(65) Prior Publication Data
US 2008/0024183 A1  Jan. 31, 2008

(30) Foreign Application Priority Data
Jul. 26, 2006 (KR) .................. 10-2006-0070387

(51) Int. Cl.
*H03K 3/00* (2006.01)
(52) U.S. Cl. .................. 327/218; 327/55; 327/57; 327/208; 327/219; 327/225
(58) Field of Classification Search ............. 327/51, 327/52, 55, 57, 208, 210–212, 218, 219, 327/225
See application file for complete search history.

(56) References Cited

U.S. PATENT DOCUMENTS

| 5,717,729 A | * | 2/1998 | Iknaian et al. | ............... 375/356 |
| 6,566,927 B2 | * | 5/2003 | Park et al. | ................... 327/211 |
| 2008/0030250 A1 | * | 2/2008 | Furuichi et al. | ............. 327/212 |

FOREIGN PATENT DOCUMENTS

| JP | 2004-214717 | 7/2004 |
| KR | 10-2004-0035499 | 4/2004 |

* cited by examiner

*Primary Examiner*—Lincoln Donovan
*Assistant Examiner*—William Hernandez
(74) *Attorney, Agent, or Firm*—Harness, Dickey & Pierce, P.L.C.

(57) ABSTRACT

A flip-flop includes a first circuit receiving a clock signal and the first signal and transitioning the first and second output signals to a first level when the clock signal goes to an active level, and a second circuit transitioning the first signal to the first level after the first and second output signals go to the first level. The first circuit transfers first and second input signals to the first and second output terminals from first and second input terminals when the clock signal is at the active level and the first signal is at the first level.

20 Claims, 4 Drawing Sheets

FLIP-FLOPS AND ELECTRONIC DIGITAL CIRCUITS INCLUDING THE SAME

PRIORITY STATEMENT

This U.S. non-provisional patent application claims priority under 35 U.S.C. § 119 to Korean Patent Application No. 2006-70387 filed on Jul. 26, 2006, in the Korean Intellectual Property Office (KIPO), the entire contents of which are incorporated herein by reference.

BACKGROUND

With recent developments of integration technology, operational performance of integrated circuits is increasing. For example, in the art of microprocessors, facilities of integrated circuits are advancing. Conventionally, a microprocessor is associated with flip-flops. Flip-flops provide relatively high logic clocking speeds by reducing setup times, hold times and/or clock-to-output times.

FIG. 1 is a diagram showing a delay path in a conventional digital circuit. This delay path may be utilized in a microprocessor including a first register 10, a second register 12, and a combination logic block 11 between the first and second registers 10 and 12. As shown in FIG. 1, the first and second registers 10 and 12 may operate in sync with a clock signal CLK. For convenience of description, the first and second registers 10 and 12 are assumed as being as rising-edge operable flip-flops.

FIG. 2 is an example timing diagram of signals operating in the digital circuit shown in FIG. 1. As shown in FIG. 2, the first register 10 may transfer data to the combination logic block 11 at a first rising edge of the clock signal CLK. Conventionally, there may be a delay 20, referred to as 'clock-to-output delay', after the clock signal CLK transitions. The clock-to-output delay 20 refers to a time from a transition of the clock signal CLK until data is output to the register 10. If data is output from the first register 10, the data may be transferred by way of the combination logic block 11 and arrive at an input terminal D2 of the second register 12 in a setup time 22 before the next rising edge of the clock signal CLK. The setup time 22 may be the time necessary for maintaining a stable condition of a data signal input to the second register 12 before a rising edge of the clock signal CLK.

To increase performance of the delay path, a data-to-clock time (e.g., a sum of the clock-to-output delay 20 and the setup time 22) may be reduced. Reducing data-to-clock time may increase propagation time 21 for which data is transferred through the combination logic block 11. By shortening the data-to-output time, a frequency of the clock signal CLK may be increased to improve performance of the digital circuit. A longer delay path provided to the combination logic block 11 may contribute to decreasing the number of pipeline stages required from conventional microprocessors.

Sense amplifier based flip-flops for detecting small signals may be operable at higher frequencies than conventional flip-flops, however, shortening data-to-output delay in sense amplifier based flip-flops is also limited.

SUMMARY

Example embodiments are directed to flip-flops with improved operating speeds.

In a flip-flop, according to at least one example embodiment, a first output terminal may generate a first output signal. A second output terminal may generate a second output signal, and a first circuit may receive a clock signal and the first signal. The first and second output signals may transition to a first level when the clock signal is at an active level, and a second circuit may transition the first signal to the first level after the first and second output signals go to the first level. The first circuit may transfer first and second input signals to the first and second output terminals from first and second input terminals when the clock signal is at the active level and the first signal is at the first level.

According to at least some example embodiments, the first circuit may include a first logic gate receiving the clock signal and the first signal and outputting the second signal. The first logic gate may transition the second signal to the first level while the clock signal is at the active level and the first signal is at a second level. The first input signal may be complementary to the second input signal. The first circuit may further include: a first gate circuit for selectively discharging the second output terminal in response to the first input signal, and a second gate circuit selectively discharging the first output terminal in response to the second input signal.

According to at least some example embodiments, the first circuit may further include a first inverter outputting a first inverse output signal from inverting the first output signal, and a second inverter outputting a second inverse output signal from inverting the second output signal. The first circuit may further include a first logic circuit transitioning the second output signal to the first level in response to the second signal and the first inverse output signal, and a second logic circuit transitioning the first output signal to the first level in response to the second signal and the second inverse output signal. The second circuit may output the first signal in response to the first and second inverse output signals. The second circuit may include a first transistor having a source and drain connected to a power source voltage and a gate coupled to the first inverse output signal, a second transistor having a source connected to the drain of the first transistor, a drain connected to the first signal and a gate coupled to the second inverse output signal, a latch maintaining the first signal on the first level when the first signal is laid on the first level, and a discharge circuit operating to selectively discharge the first signal in response to the clock signal. The second circuit may transition the first signal to a second level when the clock signal goes to an inactive level. The first circuit may further include an equalizing circuit for equalizing the first and second output signals in response to the second signal. The equalizing circuit may include an inverter for receiving a second signal, and a switching circuit connecting the first and second output terminals to each other in response to an output of the inverter.

BRIEF DESCRIPTION OF THE FIGURES

Example embodiments will be described with reference to the following figures, wherein like reference numerals refer to like parts throughout the various figures unless otherwise specified. In the figures.

DETAILED DESCRIPTION OF EXAMPLE EMBODIMENTS

Figure 1:
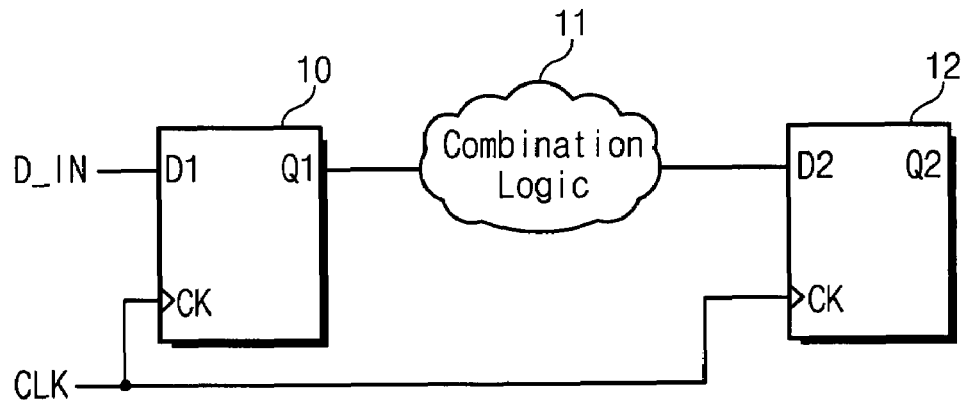
FIG. 1 is a diagram showing a delay path in a conventional digital circuit.
Figure 2:
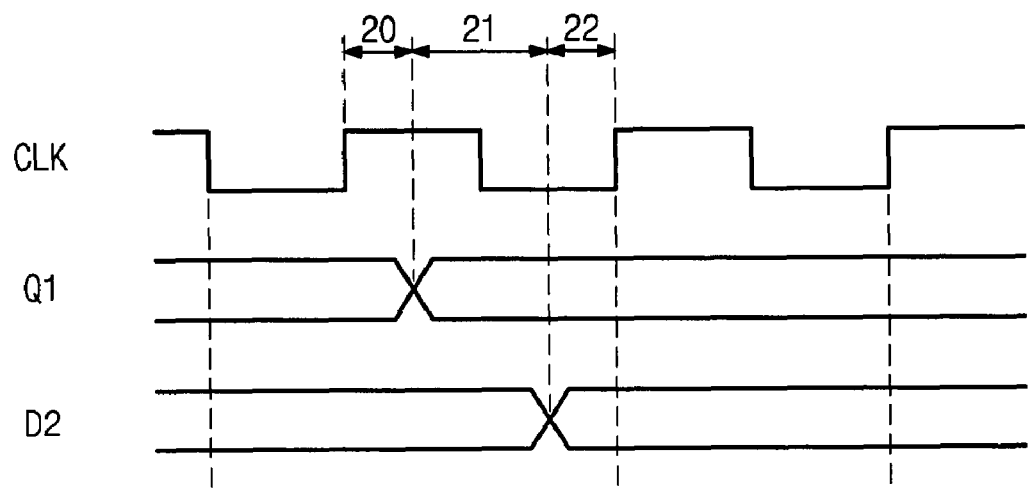
FIG. 2 is a timing diagram of signals operating in the conventional digital circuit shown in FIG. 1.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 3:
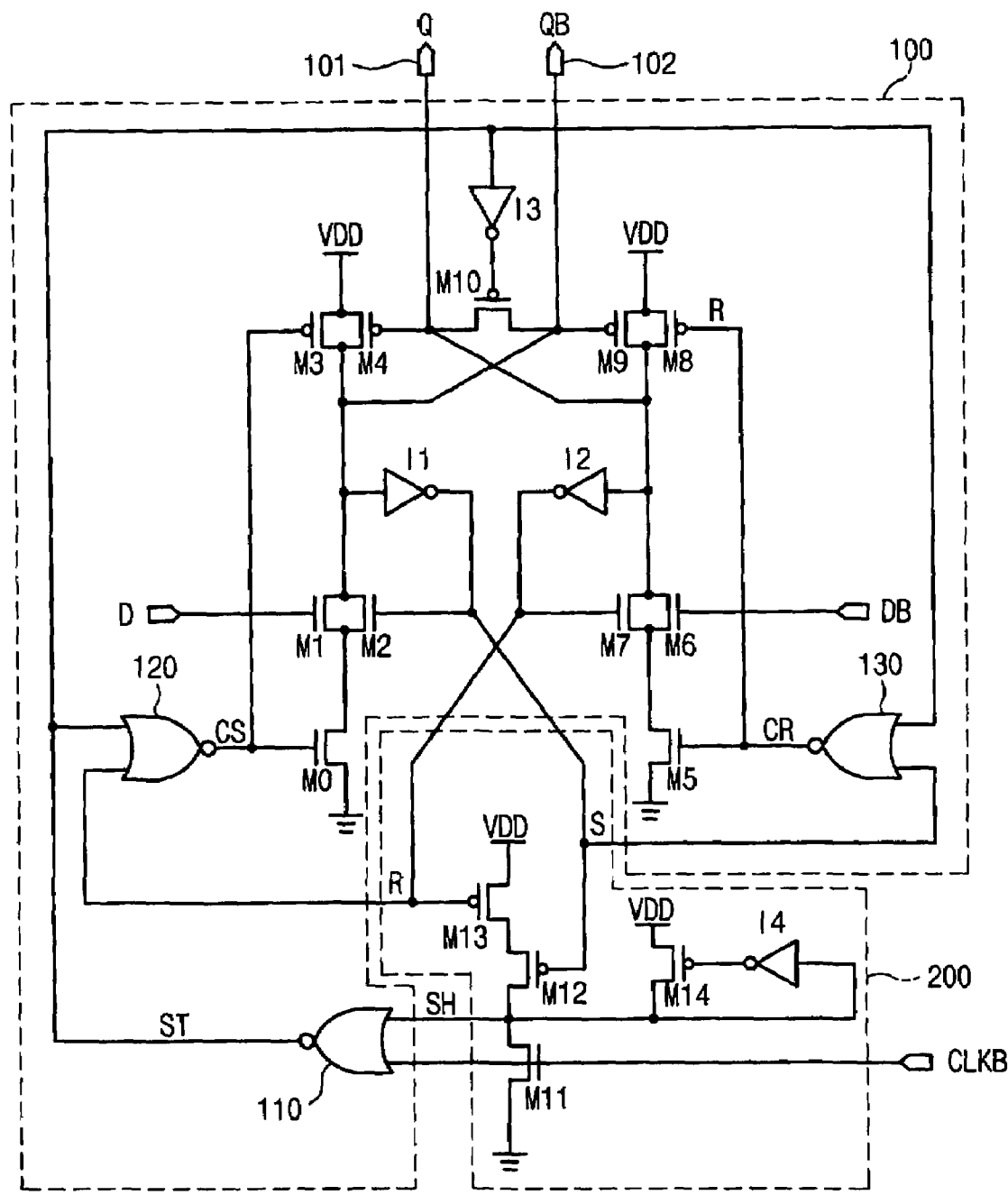
FIG. 3 is a circuit diagram of a flip-flop according to an example embodiment.

FIG. 3 is a circuit diagram of a flip-flop according to an example embodiment. Referring to FIG. 3, the flip-flop may include first and second circuits 100 and 200. The flip-flop may receive a clock signal CLKB, a first input signal D and a second input signal DB and may generate first and second output signals Q and QB based on the received signals. In at least one example, the first circuit 100 may receive the clock signal CLKB and a first signal SH output from the second circuit 200, and transition the first and second output signals Q and QB to a logic high level (e.g., logic '1') at a falling edge of the clock signal CLK. The second circuit 200 may transition the first signal SH to a logic high level when the first and second output signals Q and QB transition to a logic high level. The first circuit 100 may output the first and second input signals D and DB as the first and second output signals Q and QB through first and second output terminals 101 and 102 when the clock signal CLK is at a logic low level and the first signal SH is at a logic high level.

As such, the flip-flop, according to at least this example embodiment, may transition the first and second output signals Q and QB to a logic high level at the same or substantially the same time and in sync with a falling edge of the clock signal CLK, and may output the first and second output signals Q and QB in accordance with the first and second input signals D and DB when the first signal SH transitions to a logic high level. As a result, rising rates of the first and second output signals Q and QB may become negative.

Still referring to FIG. 3, the first circuit 100 may include logic (e.g., NOR) gates 110, 120 and 130, and transistors M0~M10. For example purposes, logic gates 110, 120 and 130 will be described as NOR gates.

The NOR gate 110 may receive the clock signal CLK and the first signal SH from the second circuit 200, and output a second signal ST based on the received signals. The NOR gate 120 may receive the second signal ST from the NOR gate 110 and a first inverted signal R from the second circuit 200, and output a third signal CS based on the received signals. The NOR gate 130 may receive the second signal ST from the NOR gate 110 and a second inverted signal S from the second circuit 200, and output a fourth signal CR based on the received signals.

The transistor (e.g., PMOS transistor) M3 and the transistor (e.g., NMOS transistors) M1 and M0 may be connected (e.g., serially connected) between a power source voltage VDD and a ground voltage. The transistors, M3 and M0, may be controlled by the third signal CS output from the NOR gate 120, while the transistor M1 may be controlled by the first input signal D. A source and drain of the transistor (e.g., PMOS transistor) M4 may be connected to a source and drain of the PMOS transistor M3, while a drain and source of the transistor M2 may be connected to a drain and source of the transistor M1.

The transistor (e.g., PMOS transistor) M8 and the transistors (e.g., NMOS transistors) M6 and M5 may be serially connected between the power source voltage VDD and the ground voltage. The transistors, M8 and M5, may be controlled by the fourth signal CR output from the NOR gate 130, while the transistor M6 may be controlled by the second input signal DB. A source and drain of the transistor (e.g., PMOS transistor) M9 may be connected to a source and drain of the transistor M8, while a drain and source of the transistor (e.g., NMOS transistor) M7 may be connected to a drain and source of the transistor M6.

A gate of the transistor M4 may be coupled to the first output terminal 101 and a drain thereof may be connected to the second output terminal 102. A gate of the transistor M9 may be coupled to the second output terminal 102 and a drain thereof may be connected to the first output terminal 101. An input terminal of an inverter I1 may be connected to the second output terminal 102 and an output terminal thereof may be coupled to a gate of the transistor M2. An input terminal of an inverter I2 may be connected to the first output terminal 101 and an output terminal thereof may be coupled to a gate of the transistor M7. A signal from the output terminal of the inverter I1 may be the second inverted signal S and a signal from the output terminal of the inverter I2 may be the first inverted signal R. An inverter I3 may receive the second signal ST output from the NOR gate 110. The transistor (e.g., PMOS transistor) M10 may be connected between the first and second output terminals 101 and 102, and be controlled by an output of the inverter I3.

The second circuit 200 may include transistors M11~M14 and an inverter I4. The transistor (e.g., PMOS transistor) M13 and M12, and the transistors (e.g., NMOS transistors) M11 may be serially connected between a power source voltage VDD and a ground voltage in order. A gate of the transistor M13 may be coupled to the first inverted signal R and a gate of the transistor M12 may be coupled to the second inverted signal S. A gate of the transistor M11 may be coupled to the clock signal CLKB. Drains of the transistors M11 and M12 may be connected to the first signal SH.

The inverter I4 may include an input terminal receiving the first signal SH. A source of the transistor (e.g., PMOS transistor) M14 may be connected to the power source voltage VDD and a drain thereof may be connected to the first signal SH. A gate of the transistor M14 may be coupled to an output terminal of the inverter I4.

Figure 4:
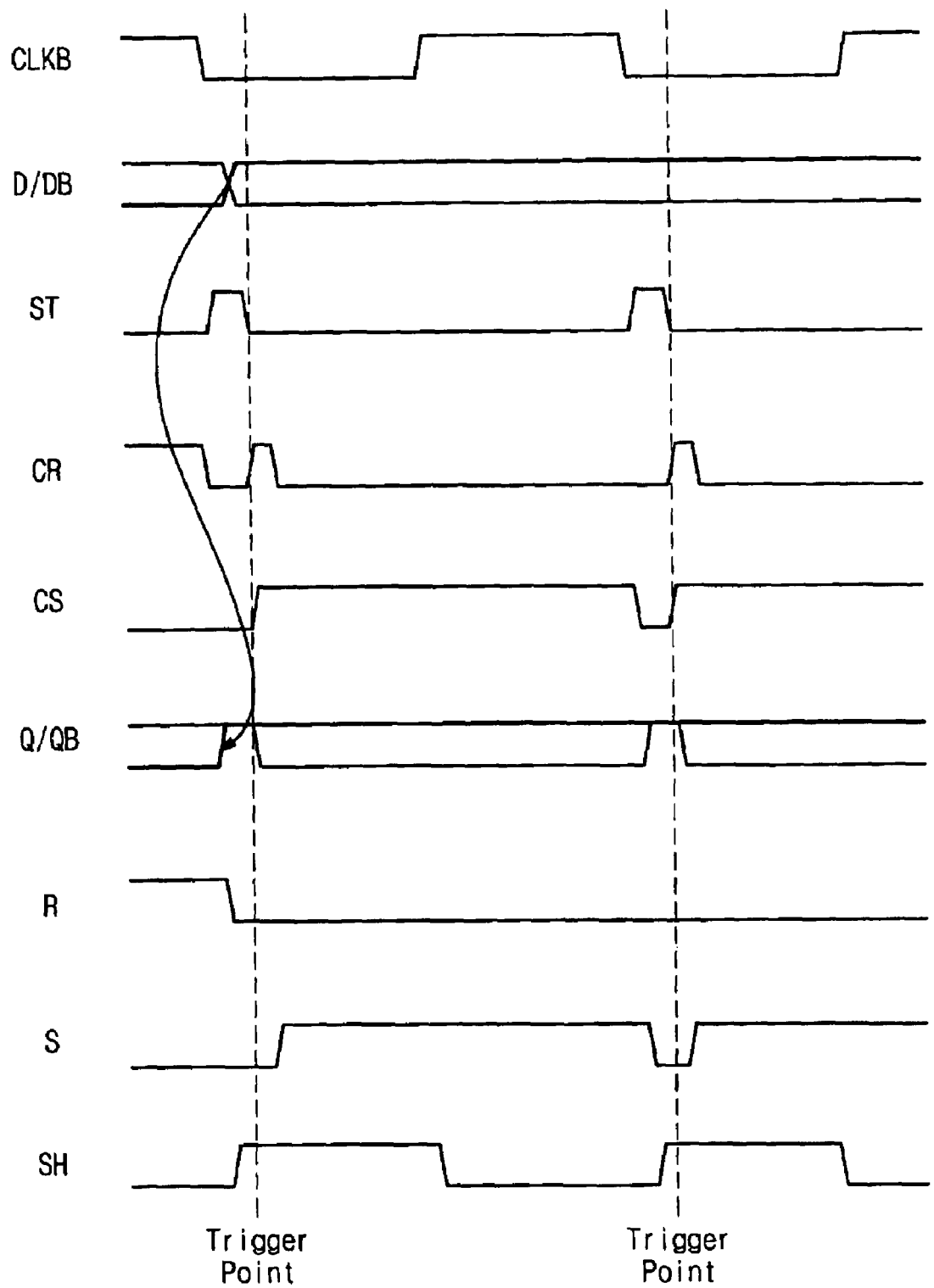
FIG. 4 is a timing diagram of signals operating in the flip-flop shown in FIG. 3.

FIG. 4 is an example timing diagram of signals operating in the flip-flop shown in FIG. 3. Hereinafter, an example operation of the flip-flop according to an example embodiment will be described. The flip-flop shown in FIG. 3 may operate at a falling edge of the clock signal CLKB.

While the clock signal CLKB is at a logic high level, the transistor M11 may be activated or turned on to maintain the first signal SH at a logic low level. If the clock signal CLKB transitions to a logic low level, the NOR gate 110 may output the second signal SH at a logic high level. Based on the transition of the second signal SH, the NOR gates 120 and 130 may output the third and fourth signals CS and CR all of which may be at logic low levels. Based on the third and fourth signals CS and CR at logic low levels, the transistors M3 and M8 may be activated or turned on causing the first and second output terminals 101 and 102 to generate the first and second output signals Q and QB at logic high levels. As the second signal ST transitions to a logic high level, the transistor M10 may be activated or turned on to equalize or substantially equalize the first and second output terminals 101 and 102.

As the first and second input signals D and DB transition to logic high levels, the first and second inverted signals R and S from the inverters I1 and I2 may transition to a logic low level to turn on at least a portion of the transistors (e.g., the PMOS transistors). Because the clock signal CLKB is at a logic low level, the transistor M11 may be turned on. Thus, the first signal SH may rise or transition to a logic high level and the second signal ST may fall or transition to a logic low level. As the first and second inverted signals, R and S, are at logic low levels and the second signal ST is also at a logic low level, the third and fourth signals CS and CR output from the NOR gates 120 and 130 may transition to a logic high level. As the second signal ST is at a logic low level, the transistor M10 may be deactivated or turned off.

Because the third and fourth signals, CS and CR, are at a logic high level, the transistors M1 and M6 may be turned on while the transistors M3 and M8 are turned off. If the first and second input signals, D and DB, are complementary to each other and applied to gates of the transistors M1 and M6, one transistor (e.g., M1 or M6) corresponding to a high-level input signal (D or DB) may be turned on while the other (e.g., M6 or M1) corresponding to a low-level input signal (DB or D) may be turned off. In FIG. 4, when the first input signal D is at a logic high level, the transistor M1 is turned on. When the second input signal DB is at a logic low level, the transistor M6 is turned off. The second output signal QB from the second output terminal 102 may transition to a logic low level because it is discharged through the transistors M1 and M0, while the first output signal Q from the first output terminal 101 maintains a logic high level.

As the second output signal QB transitions to a logic low level, the second inverted signal S may rise or transition to a logic high level. While the clock signal CLKB is at a logic low level, the first signal SH may maintain a logic high level. If the clock signal CLKB transitions to a logic high level, the first signal SH may transition to a logic low level to enable reception of the next input signals D and DB.

As shown in the timing diagram shown in FIG. 4, if the clock signal CLKB falls or transitions to a logic low level, the first and second output signals Q and QB may transition to logic high levels. When the first input signal D transitions to a logic high level from a logic low level and the second input signal DB transitions to a logic low level from a logic high level, the first output signal Q may maintain a logic high level while the second output signal QB may transition to a logic low level from a logic high level. During rising transitions of the first and second input signals D and DB, a data-to-output delay time may become negative. On the other hand, during falling transitions of the first and second input signals D and DB, a data-to-output delay time may become positive.

According to at least some example embodiments, because a latch is not included in the circuits for transferring the first and second input signals D and DB to the first and second output terminals 101 and 102, data-to-output delay time may be reduced during, for example, the falling transitions of the first and second input signals D and DB.

Figure 5:
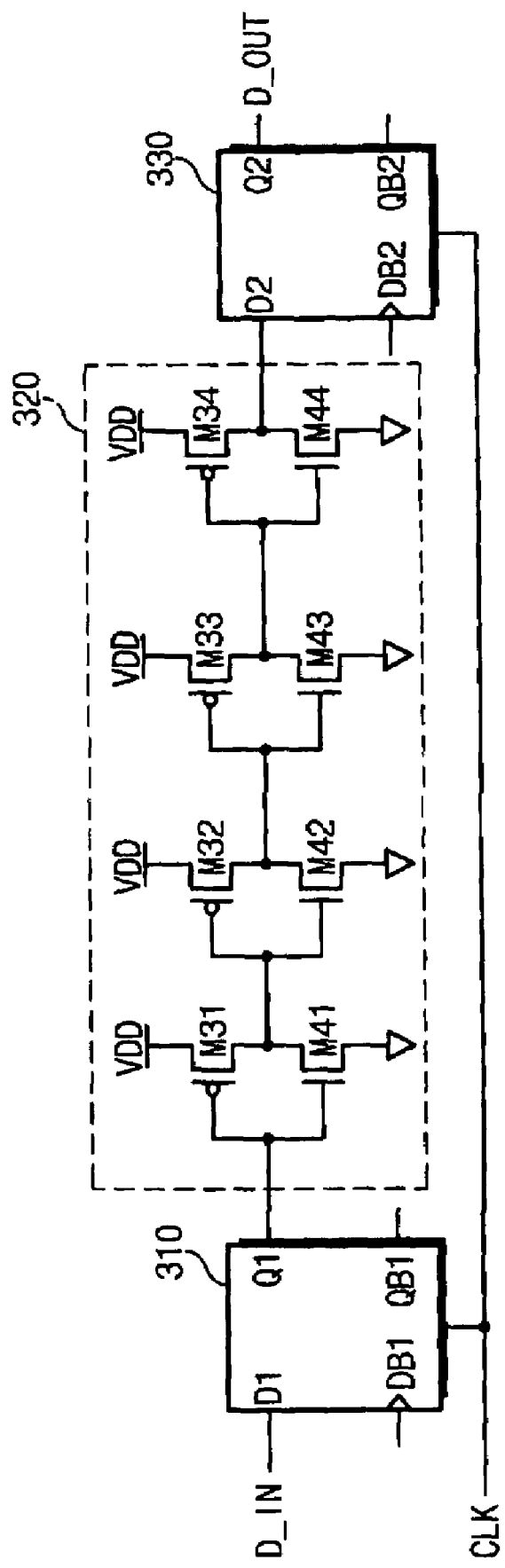
FIG. 5 is a circuit diagram of an electronic digital circuit including the flip-flop according to an example embodiment.

FIG. 5 is a circuit diagram of an electronic digital circuit including a flip-flop according to an example embodiment.

Referring to FIG. 5, logic circuit 320 may be arranged between flip-flops 310 and 330. The logic circuit 320 may include a multistage (e.g., 4-stage) inverter circuit including multiple inverters connected in series. Each inverter may include of a pair of transistors (e.g., PMOS and NMOS transistors) connected between the power source voltage VDD and the ground voltage. An inverter may be designed in a desired size ratio of PMOS and NMOS transistors to regulate signal propagation rate of high and/or low logic signals. In flip-flops 310 and 330 a data-to-output delay time may be conditioned as negative during a rising transition of an input signal D_IN, and positive during a falling transition of the input signal D_IN. Accordingly, the inverters of the logic block 320 may be designed to transfer a logic low level input signal toward the output terminal faster than a logic high level input signal. As a result, delay time for transferring the input signal D_IN to the output signal D_OUT by way of the flip-flop 310, the logic block 320, and the flip-flop 330 during a rising transition of the input signal D_IN may become similar or substantially similar to that during a falling transition of the input signal D_IN.

Further, because a data-to-output delay time is a negative value during a rising transition of an input signal D_IN, but a smaller positive value during a falling transition of the input signal D_IN, the delay time through the flip-flop 310, the logic circuit 320, and the flip-flop 330 may be reduced and/or operation operating speed of the electronic digital circuit may be increased.

In the timing diagram shown in FIG. 4, after a second falling edge of the clock signal CLKB, the first input signal D may maintain a logic high level while the second input signal DB maintains a logic low level. As the second signal ST transitions to a logic high level in response to the clock signal CLKB, the second output signal QB may transition to a logic low level in response to the second input signal DB after the first and second output signals Q and QB rise to a logic high level. Although the second output signal QB may rise to a logic high level, the duration of the high logic level may be relatively short, and a signal at the second output signal 102 may be a logic low level at a trigger point when an effective output signal is generated after an input of the second input signal because of a high-to-low transition of the clock signal CLKB.

In FIG. 3, the flip-flop may be structured without at least one inverter (e.g., inverter I3) and/or transistor (e.g., the transistor M10 for equalizing the first and second output terminals 101 and 102). Further, in the flip-flop shown in FIG. 3, the first inverse output signal R may be coupled to the gate of the transistor M13 and the second inverted signal S may be coupled to the gate of the transistor M12, but a structural feature in which the first inverted signal R is coupled to the gate of the transistor M12 and the second inverted signal S is coupled to the gate of the transistor M13 is also possible.

As described above, example embodiments may enhance an operating speed, rate (or frequency) of flip-flops and/or operating speeds of electronic digital circuits with the flip-flops.

The above-disclosed subject matter is to be considered illustrative, and not restrictive, and the appended claims are intended to cover all such modifications, enhancements, and other example embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A flip-flop comprising:
   a first output terminal configured to output a first output signal;
   a second output terminal configured to output a second output signal;
   a first circuit configured to receive a clock signal and a first signal, and transition the first and second output signals to a first level when the clock signal transitions to an active level; and
   a second circuit configured to generate the first signal, the second circuit being further configured to transition the first signal to the first level after the first and second output signals transition to the first level; wherein
      the first circuit is further configured to transfer first and second input signals to the first and second output terminals from first and second input terminals when the clock signal is at the active level and the first signal is at the first level.

2. The flip-flop as set forth in claim 1, wherein the first circuit includes,
   a first logic gate configured to receive the clock signal and the first signal and output a second signal, wherein
      the first circuit outputs the first and second output signals based on the second signal.

3. The flip-flop as set forth in claim 2, wherein the first logic gate transitions the second signal to the first level while the clock signal is at the active level and the first signal is at a second level.

4. The flip-flop as set forth in claim 3, wherein the first input signal is complementary to the second input signal.

5. The flip-flop as set forth in claim 4, wherein the first circuit further includes,
   a first gate circuit configured to selectively output the second output signal in response to the first input signal; and
   a second gate circuit configured to selectively discharge the first output signal in response to the second input signal.

6. The flip-flop as set forth in claim 5, wherein the first circuit further includes,
   a first inverter configured to generate a first inverted signal by inverting the first output signal; and
   a second inverter configured to generate a second inverted signal by inverting the second output signal.

7. The flip-flop as set forth in claim 6, wherein the first circuit further includes,
   a first logic circuit configured to transition the second output signal to the first level based on the second signal and the first inverted signal, and
   a second logic circuit configured to transition the first output signal to the first level based on the second signal and the second inverted output signal.

8. The flip-flop as set forth in claim 6, wherein the second circuit generates the first signal based on the first and second inverted signals.

9. The flip-flop as set forth in claim 8, wherein the second circuit includes,
   a first transistor having a source and drain connected to a power source voltage, and a gate receiving the first inverted signal,
   a second transistor having a source connected to the drain of the first transistor, a drain connected to the first signal, and a gate receiving the second inverted signal,
   a latch maintaining the first signal at the first level when the first signal transitions to the first level, and
   an output circuit configured to selectively output the first signal in response to the clock signal.

10. The flip-flop as set forth in claim 1, wherein the second circuit transitions the first signal to a second level when the clock signal transitions to an inactive level.

11. The flip-flop as set forth in claim 3, wherein the first circuit further includes,
   an equalizing circuit configured to equalize the first and second output signals in response to the second signal.

12. The flip-flop as set forth in claim 11, wherein the equalizing circuit includes,
   an inverter configured to receive a second signal, and
   a switching circuit configured to selectively connect the first and second output terminals to each other based on an output of the inverter.

13. An electronic digital circuit comprising:
   at least one flip-flop as claimed in claim 1; and
   an inverter circuit, configured to invert at least one of the first and second output signals from one of at least one flip-flop to generate the inverted output signal.

14. The electronic digital circuit as set forth in claim 13, wherein the first circuit includes,
   a first logic gate configured to receive the clock signal and the first signal and output a second signal, wherein
      the first circuit outputs the first and second output signals based on the second signal.

15. The electronic digital circuit as set forth in claim 14, wherein the first logic gate transitions the second signal to the first level while the clock signal is at the active level and the first signal is at a second level.

16. The electronic digital circuit as set forth in claim 15, wherein the first input signal is complementary to the second input signal.

17. The electronic digital circuit as set forth in claim 16, wherein the first circuit further includes,
   a first gate circuit configured to selectively output the second output signal in response to the first input signal; and
   a second gate circuit configured to selectively discharge the first output signal in response to the second input signal.

18. The flip-flop as set forth in claim 17, wherein the first circuit further includes,
   a first inverter configured to generate a first inverted signal by inverting the first output signal; and
   a second inverter configured to generate a second inverted signal by inverting the second output signal.

19. The flip-flop as set forth in claim 18, wherein the first circuit further includes,
   a first logic circuit configured to transition the second output signal to the first level based on the second signal and the first inverted signal, and
   a second logic circuit configured to transition the first output signal to the first level based on the second signal and the second inverted output signal.

20. The flip-flop as set forth in claim 18, wherein the second circuit generates the first signal based on the first and second inverted signals.

* * * * *